United States Patent
Wei et al.

(10) Patent No.: US 12,266,507 B2
(45) Date of Patent: Apr. 1, 2025

(54) IMPEDANCE-MATCHING METHOD, IMPEDANCE-MATCHING DEVICE, AND SEMICONDUCTOR PROCESS APPARATUS

(71) Applicant: BEIJING NAURA MICROELECTRONICS EQUIPMENT CO., LTD., Beijing (CN)

(72) Inventors: Jing Wei, Beijing (CN); Gang Wei, Beijing (CN); Yueping Hua, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 124 days.

(21) Appl. No.: 18/248,870

(22) PCT Filed: Oct. 12, 2021

(86) PCT No.: PCT/CN2021/123317
§ 371 (c)(1),
(2) Date: Apr. 13, 2023

(87) PCT Pub. No.: WO2022/078336
PCT Pub. Date: Apr. 21, 2022

(65) Prior Publication Data
US 2023/0386790 A1 Nov. 30, 2023

(30) Foreign Application Priority Data
Oct. 13, 2020 (CN) .......................... 202011089179.4

(51) Int. Cl.
*H01J 37/32* (2006.01)
*H05H 1/46* (2006.01)

(52) U.S. Cl.
CPC ..... *H01J 37/32183* (2013.01); *H01J 2237/32* (2013.01); *H05H 1/46* (2013.01)

(58) Field of Classification Search
CPC .................. H05H 1/46; H01J 37/32183; H01J 2237/32
See application file for complete search history.

(56) References Cited

U.S. PATENT DOCUMENTS

| 10,643,822 B2 * | 5/2020 | Cheng | ..................... H01J 37/32 |
| 10,699,881 B2 * | 6/2020 | Wei | .......................... H03H 7/38 |

(Continued)

FOREIGN PATENT DOCUMENTS

| CN | 101478856 A | 7/2009 |
| CN | 107992689 A | 5/2018 |

(Continued)

OTHER PUBLICATIONS

The World Intellectual Property Organization (WIPO) International Search Report for PCT/CN2021/123317 Jan. 17, 2022 6 Pages (including translation).

*Primary Examiner* — Mounir S Amer
*Assistant Examiner* — Alexander Belousov
(74) *Attorney, Agent, or Firm* — ANOVA LAW GROUP, PLLC (57) ABSTRACT

The present disclosure provides an impedance-matching method applied to a semiconductor process apparatus, an impedance-matching device, and the semiconductor process apparatus. The impedance-matching method includes adjusting a parameter value of an adjustable element of an impedance-matching device to a preset initial value at beginning of a process, when a radio frequency (RF) power supply is powered on, adjusting the parameter value of the adjustable element according to a pre-stored optimal matching path corresponding to the process, and adjusting the parameter value of the adjustable element using an automatic matching algorithm after reaching end time of the (Continued)

preset matching period until impedance-matching is achieved. The optimal matching path includes parameter values of the adjustable element corresponding to different moments in a preset matching period.

7 Claims, 4 Drawing Sheets

(56) References Cited

U.S. PATENT DOCUMENTS

| | | | | |
|---|---|---|---|---|
| 10,886,105 B2* | 1/2021 | Yang | | H01J 37/32183 |
| 10,937,633 B2* | 3/2021 | Liu | | H01J 37/32229 |
| 11,114,280 B2* | 9/2021 | Bhutta | | H01J 37/32183 |
| 11,114,281 B2* | 9/2021 | Wei | | H01J 37/32 |
| 11,189,465 B2* | 11/2021 | Wei | | H03H 7/40 |
| 11,266,004 B2* | 3/2022 | Kim | | H01J 37/32183 |
| 2019/0108977 A1* | 4/2019 | Wei | | H01L 21/67011 |
| 2020/0035461 A1* | 1/2020 | Bhutta | | H01L 21/31116 |
| 2020/0126762 A1* | 4/2020 | Yang | | H01J 37/32183 |
| 2020/0203130 A1* | 6/2020 | Bhutta | | H01L 21/32136 |
| 2020/0321194 A1* | 10/2020 | Wei | | H01L 21/67069 |
| 2020/0359489 A1* | 11/2020 | Kim | | H01J 37/32183 |
| 2021/0057188 A1* | 2/2021 | Ni | | H03H 7/40 |
| 2021/0098235 A1* | 4/2021 | Wei | | H01J 37/32183 |
| 2023/0386790 A1* | 11/2023 | Wei | | H01J 37/32183 |
| 2023/0411120 A1* | 12/2023 | Yang | | H01J 37/32183 |
| 2024/0249917 A1* | 7/2024 | Li | | H01J 37/32183 |

FOREIGN PATENT DOCUMENTS

| | | | | | |
|---|---|---|---|---|---|
| CN | 110299279 A | * | 10/2019 | | H01J 37/32091 |
| CN | 111430200 A | | 7/2020 | | |
| CN | 111430211 A | | 7/2020 | | |
| CN | 112259433 A | | 1/2021 | | |
| CN | 116779407 A | * | 9/2023 | | |
| KR | 2017012731 A | * | 2/2017 | | H01J 37/32174 |
| KR | 20170012731 A | | 2/2017 | | |

* cited by examiner

FIG. 5

IMPEDANCE-MATCHING METHOD, IMPEDANCE-MATCHING DEVICE, AND SEMICONDUCTOR PROCESS APPARATUS

CROSS-REFERENCE TO RELATED APPLICATIONS

This application is a national phase entry under 35 U.S.C. § 371 of International Application No. PCT/CN2021/123317, filed on Oct. 12, 2021, which claims priority to Chinese Application No. 202011089179.4 filed on Oct. 13, 2020, the entire contents of both of which are incorporated herein by reference.

TECHNICAL FIELD

The present disclosure generally relates to the semiconductor technology field and, more particularly, to an impedance-matching method and an impedance-matching device applied to a semiconductor process apparatus, and the semiconductor process apparatus.

BACKGROUND

In a plasma processing apparatus, a radio frequency (RF) power supply transmits RF energy to a process chamber through an impedance-matching device to excite a process gas in the process chamber to form a plasma. The plasma includes a large number of active particles, such as electrons, ions, atoms in an excited state, molecules, and free radicals. These active particles interact with a wafer to cause various physical and chemical reactions on a surface of a wafer material to complete a processing process of etching or deposition of the wafer.

In an RF energy transmission process, since an output impedance of the RF power supply is generally 50 ohms, an input impedance of the process chamber is generally a non-50 ohm impedance value having a real part impedance and an imaginary part impedance, which results in an impedance mismatch. Thus, if the RF energy is directly transmitted to the process chamber, the reflection of the RF energy will occur. That is, the RF energy transmitted to the process chamber is not enough. Therefore, normal excitement cannot be achieved, and the plasma cannot be formed. An impedance-matching device needs to be connected between the RF power supply and the process chamber to adjust the input impedance at the backend of the RF power supply to 50 ohms to normally transmit the RF energy, that is, realize the impedance matching.

A conventional impedance-matching device includes a sensor, an adjustable element, an execution unit, and a control unit. The sensor is configured to detect a voltage signal and a current signal of an RF transmission line in real-time and send the voltage signal and the current signal to the control unit. The control unit is configured to calculate and obtain an adjustment amount of a parameter of the adjustable element through an automatic matching algorithm according to a signal detected by the sensor and control the execution unit to adjust the parameter (e.g., capacitance of an adjustable capacitor) of the adjustable unit according to the adjustment amount until the impedance matching state is reached. Thus, the maximum RF power can be transmitted to the process chamber to excite and form the plasma.

However, in the above matching process, especially for ICP (inductively coupled plasma), since the plasma is in an unstable state of an E-H mode transition (i.e., from mode E to mode H) during an ignition process, which results in different and non-repetitive matching paths of different processes. Thus, differences in matching time used required by processes for processing different wafers exist, which causes different process results between wafers. Especially for processes with short process time, the differences in the process results are more obvious.

SUMMARY

The purpose of the present disclosure is to at least solve one of the technical problems in the existing technology and provide an impedance-matching method and an impedance-matching device applied to a semiconductor process apparatus and the semiconductor process apparatus, which can improve the repetitiveness and stability of the process, improve the consistency of the process results, and realize a precision adjustment of the plasma impedance.

To realize the above purpose, embodiments of the present disclosure provide an impedance-matching method applied to a semiconductor process apparatus, including:
  adjusting a parameter value of an adjustable element of an impedance-matching device to a preset initial value at beginning of a process;
  adjusting the parameter value of the adjustable element according to a pre-stored optimal matching path corresponding to the process when a radio frequency (RF) power supply is powered on, the optimal matching path including parameter values of the adjustable element corresponding to different moments in a preset matching period; and
  adjusting the parameter value of the adjustable element using an automatic matching algorithm after reaching end time of the preset matching period until impedance matching is achieved.

In some embodiments, an acquisition method of the optimal matching path includes:
  adjusting the parameter value of the adjustable element to an initial value;
  powering on the RF power supply, adjusting the parameter value of the adjustable element using an automatic matching algorithm until the impedance matching is achieved, recording parameter values of the adjustable element corresponding to different moments in an entire matching process to obtain a matching path;
  repeating a step of obtaining the matching path for N times, N being an integer greater than or equal to a determined value; and
  selecting a matching path from N matching paths as the optimal matching path and saving the optimal matching path.

In some embodiments, selecting the matching path from the N matching paths as the optimal matching path and saving the optimal matching path includes:
  selecting matching paths without an extinction phenomenon from the N matching paths; and
  selecting a matching path with a most occurrence number from the matching paths without the extinction phenomenon as the optimal matching path and saving the optimal matching path.

In some embodiments, the impedance-matching method further includes, before a step of adjusting the parameter value of the adjustable element of the impedance-matching device to the preset initial value:
  determining whether the optimal matching path corresponding to the process is stored;

if yes, performing the step of adjusting the parameter value of the adjustable element of the impedance-matching device to the preset initial value; and if not, performing the acquisition method of the optimal matching path and returning to the step of determining whether the optimal matching path corresponding to the process is stored.

In some embodiments, the determined value is greater than or equal to 20.

In some embodiments, the initial value is a corresponding parameter value of the adjustable element satisfying a plasma ignition condition.

In some embodiments, when different to-be-processed workpieces are processed using the same process, and the preset initial value is the same.

In some embodiments, the adjustable element is an adjustable capacitor, and the parameter value of the adjustable element is a capacitance value or a capacitor position of the adjustable capacitor.

As another technical solution, embodiments of the present disclosure further provide an impedance-matching device, including a sensor configured to detect a voltage signal and a current signal on a radio frequency (RF) transmission line, an adjustable element, an execution unit, a storage unit, and a control unit.

The execution unit is configured to adjust a parameter value of the adjustable element;

The storage unit is configured to save an initial value of the parameter value of the adjustable element and an optimal matching path corresponding to different processes. The optimal matching path includes parameter values of the adjustable element corresponding to different moments in a preset matching period.

The sensor is configured to detect a voltage signal and a current signal on an RF transmission line in real-time and send the voltage signal and the current signal to the control unit after reaching end time of the preset matching period.

The control unit is configured to call the initial value saved in the storage unit and control the execution unit to adjust the parameter value of the adjustable element to the initial value when the process starts, call the optimal matching path corresponding to a current process saved in the storage unit and control the execution unit to adjust the parameter value of the adjustable element according to the optimal matching path when the RF power supply is powered on, and control the execution unit to adjust the parameter value of the adjustable element using an automatic matching algorithm after reaching end time of the preset matching period until impedance matching is achieved.

As another technical solution, embodiments of the present disclosure further provide a semiconductor process apparatus, including a process chamber and a radio frequency (RF) power supply configured to apply RF power to the process chamber through an impedance-matching device, wherein the impedance-matching device includes the impedance-matching device of embodiments of the present disclosure.

In some embodiments, a plasma source used by the semiconductor processing apparatus is an inductively coupled plasma source or a capacitively coupled plasma source.

Embodiments of the present disclosure include the following beneficial effects.

In the technical solution of the impedance-matching method and the impedance-matching device applied to the semiconductor process apparatus of embodiments of the present disclosure, the parameter value of the adjustable element is firstly adjusted according to the pre-stored optimal matching path corresponding to the process. Then, the parameter value of the adjustable element is adjusted using the automatic matching algorithm until the impedance matching is achieved after the end time of the preset matching period is reached. When different workpieces are processed using the same process, the matching is performed using the pre-stored optimal matching path in the ignition phase. Thus, the matching paths used by the process for processing the different workpieces can be substantially the same in the ignition phase. Meanwhile, the matching can be performed according to the optimal matching path to avoid the extinction phenomenon to improve the repetitiveness and the stability of the process and further improve the consistency of the process results. In addition, the automatic matching is performed by switching to the automatic matching algorithm after the optimal matching path is completed. Thus, the small change in the plasma impedance generated as the process time changes can be monitored in real-time. Thus, the plasma impedance can be precisely adjusted.

In the semiconductor process apparatus of embodiments of the present disclosure, using the impedance-matching device of embodiments of the present disclosure, the repetitiveness and stability of the process can be improved, and the consistency of the process results can be improved. Moreover, the plasma impedance can be precisely adjusted.

DETAILED DESCRIPTION OF THE EMBODIMENTS

To make those skilled in the art to better understand the technical solutions of the present disclosure, an impedance-matching method, an impedance-matching device, and a semiconductor process apparatus provided by embodiments of the present disclosure are described in detail below in connection with the accompanying drawings.

Figure 1:
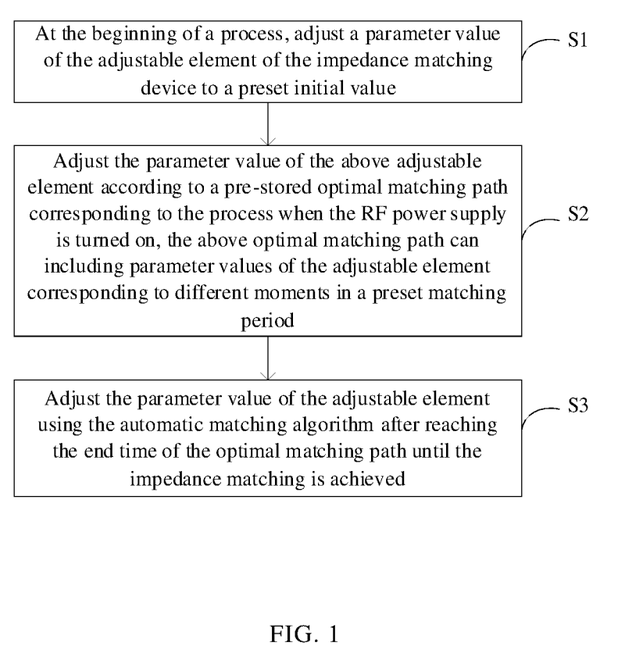
FIG. 1 illustrates a schematic flow block of an impedance-matching method applied to a semiconductor process apparatus according to a first embodiment of the present disclosure.

FIG. 1 illustrates a schematic flow block of an impedance-matching method applied to a semiconductor process apparatus according to a first embodiment of the present disclosure. The method includes the following steps.

At S1, at the beginning of a process, a parameter value of the adjustable element of the impedance-matching device is adjusted to a preset initial value.

Figure 2:
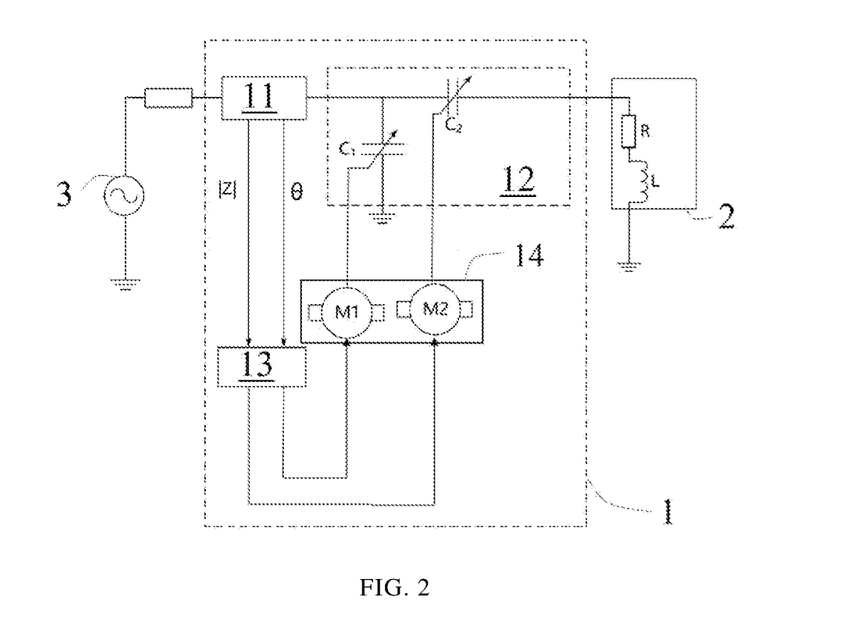
FIG. 2 illustrates a schematic principle diagram of an impedance-matching device according to some embodiments of the present disclosure.

Taking an impedance-matching device 1 shown in FIG. 2 as an example, the impedance-matching device 1 is connected between a radio frequency (RF) power supply 3 and a process chamber 2 to adjust an input impedance of a backend of the RF power supply 3 to realize a normal transmission of RF energy. That is, impedance matching can be achieved. In some embodiments, the impedance-matching device 1 includes a sensor 11, a matching network 12, an execution unit 14, and a control unit 13. The sensor 11 can be configured to detect a voltage signal and a current signal on the RF transmission line in real-time and send the voltage signal and the current signal to the control unit 13. The matching network 12 includes two adjustable capacitors (C1, C2). The two adjustable capacitors can be used as adjustable elements. The capacitance value or capacitor position of the two adjustable capacitors can be the parameter value of the adjustable element. The control unit 13 can be configured to control two motors (M1, M2) to adjust capacitor positions of the two adjustable capacitors (C1, C2). Different capacitor positions can correspond to different capacitances. Thus, the input impedance at the backend of the RF power supply 3 can be adjusted to achieve the purpose of impedance matching. Of course, in practical applications, the structure of the impedance-matching device is not limited to the structure of the above impedance-matching device shown in FIG. 2. The adjustable element can also have any other structure that can adjust the input impedance of the backend of the RF power supply 3, e.g., an adjustable inductor or a combination of the adjustable capacitor and the adjustable inductor, etc. The matching network 12 can be, for example, an L-type, a it-type, or a T-type.

In some embodiments, an initial value of the parameter value of the above adjustable element can satisfy a plasma ignition condition, that is, the parameter value of the adjustable element required to realize the plasma ignition. The plasma ignition condition can be that the RF power loaded into the process chamber is sufficient to maximize an electric field strength generated by a chamber resonance to accelerate the electrons to collide to excite and form the plasma.

Under a normal situation, when a hardware condition of the process chamber is fixed, the condition for realizing the plasma ignition of the process chamber can be also fixed. Based on this, in some embodiments, when the same process is used to process different workpieces, the preset initial value can be the same. That is, at the beginning of the process of processing different workpieces, the parameter value of the adjustable element can be adjusted to the same initial value, which helps to improve the repetitiveness of the process to improve the consistency of the process results.

At S2, the parameter value of the above adjustable element is adjusted according to a pre-stored optimal matching path corresponding to the process when the RF power supply is turned on.

The above optimal matching path can include parameter values of the adjustable element corresponding to different moments in a preset matching period.

Adjusting the parameter value of the above adjustable element according to the optimal matching path means that when the parameter value is adjusted and to what value the parameter value is adjusted can be preset in the preset matching period. That is, the parameter values of the adjustable element corresponding to different moments can be preset. The parameter values set according to a time sequence can form the matching path. During a process of performing matching according to the matching path, the control unit 13 may only need to directly adjust the parameter value of the adjustable element in a moment to cause the parameter values to be equal to the preset parameter value corresponding to the moment.

The optimal matching path can refer to a matching path that satisfies conditions such as no extinction phenomenon, highest repetitiveness, and best stability.

When different workpieces are processed in a same process, the matching can be performed using the pre-stored optimal matching path at an ignition stage. That is, the matching paths used in the process at the ignition stage for processing the different workpieces can be substantially the same. The extinction phenomenon can be avoided when performing the matching according to the optimal matching path to improve the repetitiveness and stability of the process and further improve the consistency of the process results.

A plurality of acquisition methods of the above optimal matching path can be provided. For example, the acquisition method can include the following steps.

In step 1, the parameter value of the adjustable element is adjusted to the initial value.

The initial value can be the same as the initial value in step S1.

In step 2, the RF power supply is turned on, and the parameter value of the adjustable element is adjusted using an automatic matching algorithm until impedance matching is achieved. The parameter values of the adjustable element corresponding to different moments in the entire matching process are recorded to obtain the matching path.

The above automatic matching algorithm can include using the sensor 11 to detect the voltage signal and the current signal on the RF transmission line in real-time, and according to the voltage signal and the current signal, calculating the adjustment amount of the parameter value of the adjustable element, and automatically adjusting the parameter value of the adjustable element according to the adjustment amount (e.g., the capacitance or capacitor position of the adjustable capacitor) until the impedance matching state is achieved.

Figure 3:
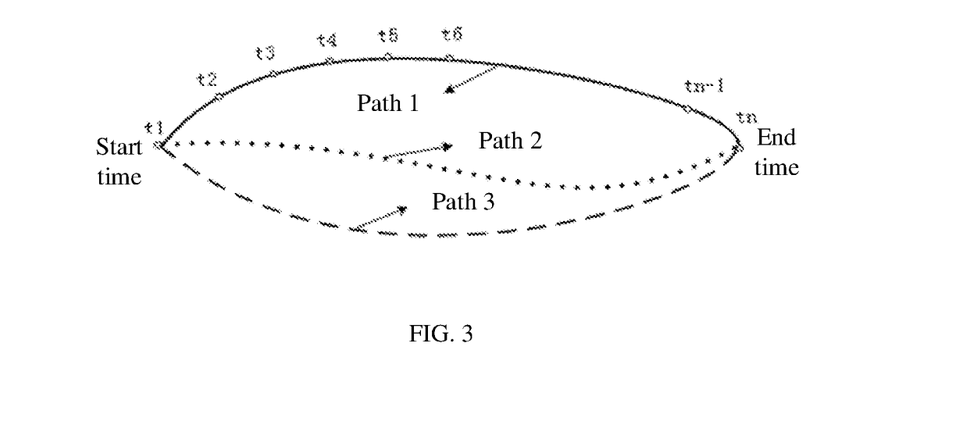
FIG. 3 illustrates a schematic diagram of a matching path according to a first embodiment of the present disclosure.

As shown in FIG. 3, in the entire matching process of performing impedance matching according to the matching path, n moments (t1, t2, . . . , tn−1, and tn) are selected from the preset matching period. The parameter values corresponding to the moments can be recorded. A moment number n can be determined according to a specific process condition. A set of parameter values corresponding to n moments can form a matching path. For example, three matching paths composed of three sets of parameter values are shown in FIG. 3, such as path 1, path 2, and path 3. For example, the parameter values of the adjustable elements can be the capacitances of the two adjustable capacitors C1 and C2. In table 1, a correspondence between the moment and the capacitances of each matching path is shown below.

TABLE 1 the correspondence between the moments and the capacitance values of each matching path

| Moment | C1 capacitance value | C2 capacitance value | |
|---|---|---|---|
| t1 | C11 | C21 | Start time |
| t2 | C12 | C22 | — |
| t3 | C13 | C23 | — |
| t4 | C14 | C24 | — |
| t5 | C15 | C25 | — |
| t6 | C16 | C26 | — |
| . . . | . . . | . . . | — |
| tn−1 | C1n−1 | C2n−1 | |
| tn | C1n | C2n | End time |

From the above Table 1 and FIG. 3, the parameter values (C11, C21) corresponding to the start time t1 of the three matching paths are the same. The parameter value can be, for example, equal to the initial value set to satisfy the plasma ignition condition. At this time, the start time t1 can be referred to as an ignition point. The parameter values (C1n, C2n) corresponding to the end time tn of the three paths can be the same, and the impedance matching can be achieved at the end time tn. The end time tn can be referred to as a matching point. It is easy to understand that the period between the start time t1 and the end time tn can be the preset matching period in step S2. The preset matching period can be the entire process of performing the impedance matching according to the matching path.

In step 3, the step of obtaining the matching path is repeated for N times (i.e., step 2), N being an integer greater than or equal to a specified value.

The above specified value can be set according to a specific process condition, as long as the number N obtained matching paths are sufficient to select an optimal matching path. The specified value can be, for example, greater than or equal to 20.

In step 4, a matching path is selected from the N matching paths as the optimal matching path and is stored.

The optimal matching path can be selected in a plurality of manners. For example, step 4 includes:
  in step 41, selecting matching paths without the extinction phenomenon from the N matching paths; and
  in step 42, selecting a matching path with a most occurrence number from the matching paths without the extinction phenomenon as the optimal matching path, and storing the matching path.

At S3, the parameter value of the adjustable element is adjusted using the automatic matching algorithm after reaching the end time (i.e., tn) of the optimal matching path until the impedance matching is achieved.

The above automatic matching algorithm can include detecting the voltage signal and the current signal of the RF transmission line in real-time using the sensor 11, calculating and obtaining the adjustment amount of the parameter value of the adjustable element according to the voltage signal and the current signal, and automatically adjusting the parameter value (e.g., the capacitance value or the capacitor position of the adjustable capacitor) of the adjustable element according to the adjustment amount until the impedance matching state is achieved.

Figure 4:
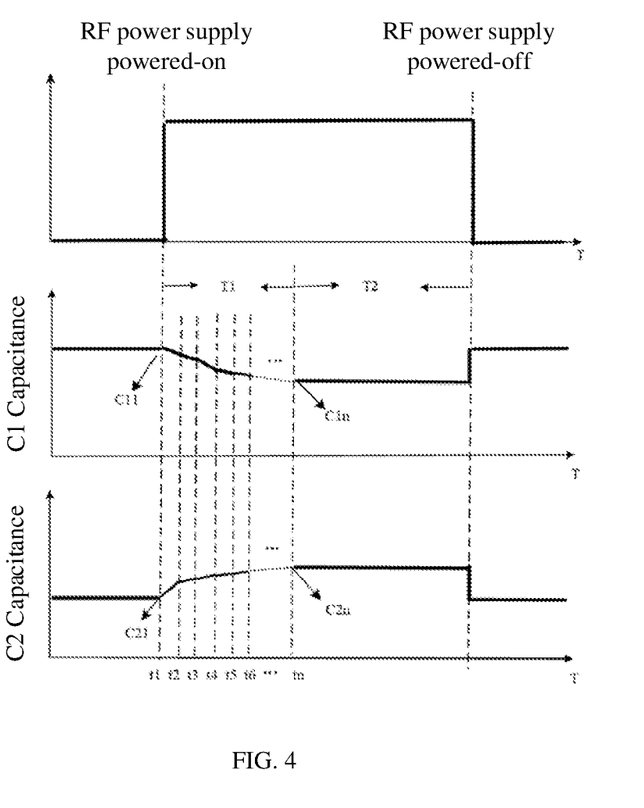
FIG. 4 illustrates a schematic diagram of a matching process according to a first embodiment of the present disclosure.

In some embodiments, as shown in FIG. 4, on time axis T, a process from power-on the RF power supply to power-off the RF power supply is the entire processing process. The processing process can include a first matching period T1 and a second matching period T2. By taking the capacitance values of the two adjustable capacitors C1 and C2 as the parameter value of the adjustable element as an example, in the first matching period T1, the capacitance values of the two adjustable capacitors C1 and C2 can be adjusted according to the optimal matching path. The power-on moment of the RF power supply can be the start time t1 of the optimal matching path, and the capacitance values corresponding to the start time t1 can be (C11, C21). The capacitance values corresponding to the end time tn of the optimal matching path can be (C1n, C2n). The impedance matching can be achieved at the end time tn. Impedance matching is achieved at the end time tn. In addition, the control unit 13 adjusts the capacitances of the two adjustable capacitors C1 and C2 according to the capacitance values corresponding to each time between the start time t1 and the end time tn.

In a second matching period T2, by detecting the voltage signal and the current signal on the RF transmission line in real-time, automatic matching can be performed using the automatic matching algorithm according to the voltage signal and the current signal. Thus, small changes of the plasma impedance can be monitored in real-time as the processing time changes. Thus, the plasma impedance can be precisely adjusted.

Figure 5:
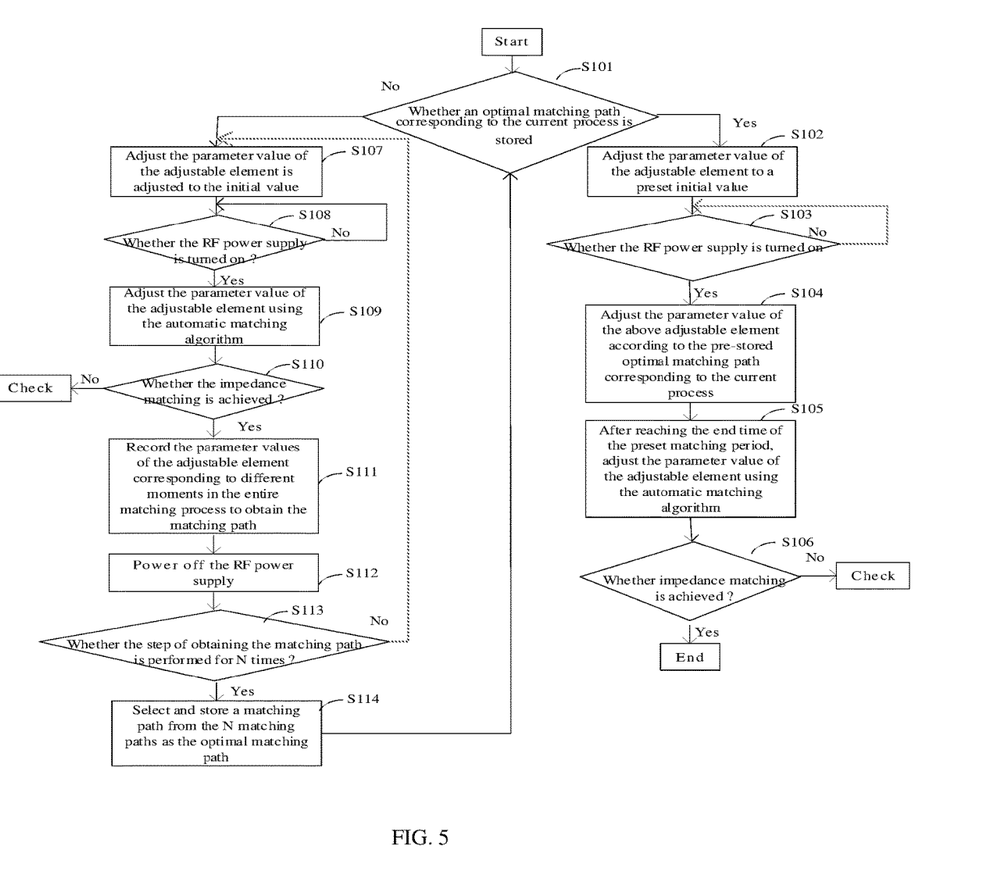
FIG. 5 illustrates a schematic flow block diagram of an impedance-matching method applied to a semiconductor process apparatus according to a second embodiment of the present disclosure.

FIG. 5 illustrates a schematic flow block diagram of an impedance-matching method applied to a semiconductor process apparatus according to a second embodiment of the present disclosure. The method is a specific implementation of the first embodiment. In some embodiments, the impedance-matching method includes the following steps.

At S101, whether an optimal matching path corresponding to the current process is stored is determined.

If yes, step S102 is performed, and if not, step S107 is performed.

At S102, the parameter value of the adjustable element is adjusted to a preset initial value.

At S103, whether the RF power supply is turned on is determined.

If yes, step S104 is performed, and if not, step S103 is performed.

At S104, the parameter value of the above adjustable element is adjusted according to the pre-stored optimal matching path corresponding to the current process.

At S105, after reaching the end time (i.e., tn) of the preset matching period, the parameter value of the adjustable element can be adjusted using the automatic matching algorithm.

At S106, whether impedance matching is achieved is determined.

If yes, then the process ends, and if no, the problem of not achieving the impedance matching is checked.

At S107, the parameter value of the adjustable element is adjusted to the initial value.

At S108, whether the RF power supply is turned on is determined.

If yes, step S109 is performed, and if not, step S108 is performed.

At S109, the parameter value of the adjustable element is adjusted using the automatic matching algorithm.

At S110, whether the impedance matching is achieved is determined.

If yes, step S111 is performed, and if not, the problem of not achieving the impedance matching is checked.

At S111, the parameter values of the adjustable element corresponding to different moments in the entire matching process are recorded to obtain the matching path.

At S112, the RF power supply is powered off.

At S113, whether the step of obtaining the matching path is performed for N times (i.e., step 2) is determined.

If yes, step S114 is performed, and if not, step S101 is performed.

At S114, a matching path is selected from the N matching paths as the optimal matching path and is stored.

In the impedance-matching method applied to the semiconductor process apparatus of embodiments of the present disclosure, when the current process does not store the corresponding optimal matching path, the optimal matching path can be automatically obtained, which is suitable for the impedance matching of all processes.

As another technical solution, embodiments of the present disclosure further provide the impedance-matching device. Taking the impedance-matching device 1 shown in FIG. 2 as an example, the impedance-matching device 1 includes the sensor 11, the adjustable element e.g., two adjustable capacitors C1 and C2), the execution unit 14, a storage unit (not shown in the figure), and the control unit 13.

The execution unit 14 can be configured to adjust the parameter value of the adjustable element. For example, the execution unit 14 can be a motor. Taking the adjustable element as two adjustable capacitors C1 and C2 as an example, the execution unit 14 can include two motors M1 and M2, which are configured to adjust the capacitor positions of the two adjustable capacitors C1 and C2 to adjust the capacitances of the two capacitors. The storage unit can be configured to store an initial value of the parameter value of the adjustable element and optimal matching paths corresponding to different processes. The optimal matching path can include the parameter values of the adjustable element corresponding to different moments within the preset matching period. The sensor 11 can be configured to detect the voltage signal and the current signal on the RF transmission line in real-time after the end time of the preset matching period is reached and send the voltage signal and the current signal to the control unit 13. The control unit 13 can be configured to call the initial value stored in the storage unit when the process starts and control the execution unit 14 to adjust the parameter value of the adjustable element to the initial value. The control unit 13 can be further configured to call the optimal matching path corresponding to the current process stored in the storage unit when the RF power supply 3 is powered on and control the execution unit 14 to adjust the parameter value of the adjustable element according to the optimal matching path. After the end time of the preset matching period is reached, the control unit 13 can be configured to control the execution unit 14 to adjust the parameter value of the adjustable element using the automatic matching algorithm according to the received voltage signal and the current signal until the impedance matching is reached.

In summary, in the impedance-matching method and impedance-matching device applied to the semiconductor process apparatus of embodiments of the present disclosure, firstly, the parameter value of the adjustable element can be adjusted according to the pre-stored optimal matching path corresponding to the process. Then, after the end time of the preset matching period is reached, the parameter value of the adjustable element can be adjusted using the automatic matching algorithm until the impedance matching is achieved. When different to-be-processed workpieces are processed using the same process, the matching can be performed using the pre-stored optimal matching path in the ignition stage. Thus, matching paths adopted by the processes for processing the different to-be-processed workpieces in the ignition stage can be substantially the same. The extinction phenomenon can be avoided by performing the matching according to the optimal matching path to improve the repetitiveness and stability of the process. Thus, the consistency of the process results can be further improved. In addition, after the optimal matching path is completed, the automatic matching can be performed by switching to the automatic matching algorithm. Thus, the small change of the plasma impedance generated as the process time changes can be monitored in real-time to realize the precision adjustment of the plasma impedance.

As another technical solution, embodiments of the present disclosure further provide a semiconductor process apparatus, including a process chamber and an RF power supply configured to load RF power to the process chamber through the impedance-matching device. The impedance-matching device can be the impedance-matching device of embodiments of the present disclosure.

In some embodiments, a plasma source used by the above semiconductor process apparatus can be an inductively coupled plasma source or a capacitively coupled plasma source.

In the semiconductor process apparatus of embodiments of the present disclosure, by using the impedance-matching device of embodiments of the present disclosure, the repetitiveness and stability of the process can be improved to improve the consistency of the process results. Thus, the precision adjustment of the plasma impedance can be achieved.

It can be understood that the above embodiments are only exemplary embodiments to illustrate the principle of the present disclosure. However, the present disclosure is not limited to this. For those skilled in the art, without departing from the spirit and essence of the present disclosure, various modifications and improvements can be made, and these modifications and improvements are also regarded as the protection scope of the present disclosure.

What is claimed is:

1. An impedance-matching method applied to a semiconductor process apparatus, comprising:
    adjusting a parameter value of an adjustable element of an impedance-matching device to a preset initial value at beginning of a process;
    adjusting the parameter value of the adjustable element according to a pre-stored optimal matching path corresponding to the process in response to a radio frequency (RF) power supply being powered on, the optimal matching path including parameter values of the adjustable element corresponding to different moments in a preset matching period; and
    adjusting the parameter value of the adjustable element using an automatic matching algorithm after reaching end time of the preset matching period until impedance matching is achieved, the optimal matching path being a matching path with a most occurrence number without an extinction phenomenon of N matching paths obtained by performing the automatic matching algorithm for N times.

2. The impedance-matching method according to claim 1, wherein obtaining the optimal matching path includes:
    adjusting the parameter value of the adjustable element to an initial value;
    powering on the RF power supply, adjusting the parameter value of the adjustable element using an automatic matching algorithm until the impedance matching is achieved, recording parameter values of the adjustable element corresponding to different moments in an entire matching process to obtain a matching path;
    repeating obtaining the matching path for N times, N being an integer greater than or equal to a determined value; and
    selecting a matching path from the N matching paths as the optimal matching path and saving the optimal matching path.

3. The impedance-matching method according to claim 2, wherein selecting the matching path from the N matching paths as the optimal matching path and saving the optimal matching path includes:
    selecting matching paths without the extinction phenomenon from the N matching paths; and
    selecting the matching path with the most occurrence number from the matching paths without the extinction phenomenon as the optimal matching path and saving the optimal matching path.

4. The impedance-matching method according to claim 2, further comprising, before adjusting the parameter value of the adjustable element of the impedance-matching device to the preset initial value:
- determining whether the optimal matching path corresponding to the process is stored;
- in response to the optimal matching path corresponding to the process being stored, performing adjusting the parameter value of the adjustable element of the impedance-matching device to the preset initial value; and
- in response to the optimal matching path corresponding to the process not being stored, performing obtaining the optimal matching path and returning to determining whether the optimal matching path corresponding to the process is stored.

5. The impedance-matching method according to claim 2, wherein the determined value is equal to 20.

6. The impedance-matching method according to claim 1, wherein the initial value is a parameter value of the adjustable element corresponding to a plasma ignition condition.

7. The impedance-matching method according to claim 6, wherein the parameter value of the adjustable element is a capacitance or a capacitor position of an adjustable capacitor.

\* \* \* \* \*